(12) United States Patent
Mottola

(10) Patent No.: US 7,339,441 B2
(45) Date of Patent: Mar. 4, 2008

(54) CIRCUIT AND METHOD FOR QUICKLY TURNING OFF MOS DEVICE

(75) Inventor: Michael J. Mottola, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 151 days.

(21) Appl. No.: 11/385,147

(22) Filed: Mar. 20, 2006

(65) Prior Publication Data

US 2007/0216384 A1    Sep. 20, 2007

(51) Int. Cl.
*H03B 5/36* (2006.01)
(52) U.S. Cl. .............................. 331/116 FE; 331/109; 327/534; 330/255
(58) Field of Classification Search ................ 331/158, 331/183, 186, 109, 116 FE, 182; 323/265, 323/279; 327/534–36; 330/255, 270
See application file for complete search history.

(56) References Cited

U.S. PATENT DOCUMENTS

| | | | | |
|---|---|---|---|---|
| 5,570,980 A | * | 11/1996 | Nakamura et al. | 409/232 |
| 5,910,737 A | * | 6/1999 | Kesler | 327/89 |
| 5,999,062 A | * | 12/1999 | Gilbert | 331/116 R |
| 6,674,247 B1 | * | 1/2004 | Mead et al. | 315/241 P |
| 7,138,851 B2 | * | 11/2006 | Sumita et al. | 327/534 |

* cited by examiner

*Primary Examiner*—Rajnikant B. Patel
(74) *Attorney, Agent, or Firm*—Bever, Hoffman & Harms, LLP; Jeanette S. Harms

(57) ABSTRACT

An OTA driving an MOS device needs to turn it off quickly to minimize overshoot during a heavy to light load state. The drains of the MOS device can be used to accelerate turning off the MOS device. A first drain is connected to the gate of the MOS device. A second drain is connected to a base of a bipolar device. The emitter of the bipolar device is connected to the MOS device gate. Notably, this bipolar device is active during the heavy to light load state. Therefore, any current provided by the second drain is then multiplied by the beta of the bipolar device. The increased current generated on the emitter of the bipolar transistor and provided to the gate of the MOS device can advantageously accelerate the turnoff of that MOS device. The first drain can provide minimal additional current during the heavy to light load state.

19 Claims, 5 Drawing Sheets

CIRCUIT AND METHOD FOR QUICKLY TURNING OFF MOS DEVICE

BACKGROUND OF THE INVENTION

1. Field of the Invention

The present invention relates to an operational transconductance amplifier (OTA) and in particular to quickly turning off an MOS device driven by the OTA.

2. Discussion of the Related Art

An operational transconductance amplifier (OTA) receives an input voltage that controls an output current. Thus, an OTA is in effect a voltage-controlled current source. FIG. 1 illustrates a conventional circuit 100 in which an OTA 101 drives the gate of a large MOS device (in this case a PMOS transistor) 102. Note that MOS device 102 can be implemented as a composite device with multiple transistors connected in a similar manner. MOS device 102 is configured with its source connected to voltage source VDD and its drain providing an output signal Vout. Thus, in this configuration, MOS device 102 can operate as a pass device for a positive regulator.

However, the gate of MOS device 102 is difficult to drive fast. Specifically, the gate of MOS device 102 has a large parasitic capacitance, i.e. a first parasitic capacitance between the gate and the source, a second parasitic capacitance between the gate and the drain, and a third parasitic capacitance between the gate and the channel. Because some finite impedance is driving the gate of MOS device 102 (e.g. the driver and polysilicon gate resistance), the large parasitic capacitance and the finite impedance yield a time constant.

Note that OTA 101 is typically used in circuit 100 rather than another type of amplifier because OTA 101 can easily drive rail to rail. Unfortunately, OTA 101 has high output impedance and limited current drive, thereby resulting in an undesirably large time constant. In practical terms, a large time constant means that MOS device 102 is slow to turn on/off.

To improve this drive capability, an output terminal of OTA 101 is connected to the negative input terminal of OTA 101, thereby providing negative feedback. OTA 101 receives an input voltage Vin on its positive input terminal and therefore is set up as a unity gain buffer. Thus, from a small signal perspective, the transductance of OTA 101, i.e. the gm, could be used to effectively counter the parasitic capacitance by lowering impedance at the gate of MOS device 102.

Specifically, reducing the impedance at the gate of MOS device 102 increases the small signal frequency response but does not results in faster turn on and turn off time.

One way to provide a fast turn-on and turn-off time at the gate of MOS device 102 is to provide a high current for OTA 101. Notably, the gm of OTA 101 is controlled by an external current, i.e. OTA's BIAS current. As a result of the OTA's high bias current, the external current of OTA 101 is high and thus can successfully drive the gate at high speed. Unfortunately, a high bias current is not desirable for low power applications.

Therefore, a need arises for a way to quickly drive the gate of an MOS device while not consuming too much current.

SUMMARY OF THE INVENTION

A regulator is typically connected to an off-chip load. Optimally, the regulator can provide stable operation irrespective of whether the load is light, heavy, or in transition from one state to another. To respond to these load states, the regulator receives an input voltage. A problem can arise if the regulator is slow to respond to an input voltage indicating a transition from a heavy load state to a light load state, thereby resulting in an overshoot of the regulator output voltage.

In one embodiment, a circuit implementing a regulator includes an operational transconductance amplifier (OTA) that drives the gate of an MOS device. This MOS device has parasitic capacitance associated with its gate to source, gate to drain, and gate to channel. Moreover, the OTA has large output impedance, thereby resulting in an undesirably large time constant when it drives the MOS device. This large time constant means that the MOS device is slow to turn on/off.

To improve this drive capability, an output terminal of the OTA can be connected to the negative input terminal of the OTA, thereby providing negative feedback. In this configuration, the transductance (i.e. the gm) of the OTA, through the negative feedback, lowers the impedance at the gate node, which can partially counter the parasitic gate capacitance of the MOS device. Advantageously, drain tie-backs of the MOS device can also be used to accelerate turning off the MOS device during a transition from a heavy load state to a light load state.

In one embodiment, a first drain of the MOS device can be connected to the gate of the MOS device, thereby forming a first drain tie-back. A second drain of the MOS device can be connected to a base of a bipolar device, thereby forming a second drain tie-back. A third drain of the MOS device can provide the output signal of the circuit. The first and second drains can be sized significantly smaller than the third drain.

The emitter of the bipolar device can be connected to the gate of the MOS device. Notably, this bipolar device is active during the heavy to light load state. Therefore, any current provided by the second drain tie-back is then multiplied by the beta of the bipolar device. The increased current generated on the emitter of the bipolar transistor and provided to the gate of the MOS device can advantageously accelerate the turnoff of that MOS device. The first drain tie-back can provide minimal additional current during the heavy to light load state. Note that during a transition from a light load state to heavy load state, the first and second drain tie-backs provide currents to the gate of the MOS device that keep an impedance sufficiently low such that an increased frequency response during the heavy load state maintains stability of the MOS device.

In one exemplary configuration, the circuit can also include a small current source connected between a first voltage source and the base of the bipolar transistor. The collector of the bipolar transistor and the source of the MOS transistor can also be connected to the first voltage source. The circuit can also include first and second transistors that form common source voltage gain amplifiers. The first transistor can be connected between a second voltage source and the positive input terminal of the OTA (which is also connected to the base of the bipolar transistor). The second transistor can be connected between the second voltage source and the gate of the MOS transistor. Notably, the first and second transistors receive the input signal Vin to the circuit.

In this configuration, during the light load state, the current in the first and second transistors and current in the first current source are the same, thus allowing the OTA to keep its output voltage and the plus input voltage the same. It can be seen that during the light load state, the current balance in the circuit allows the gate voltage of the MOS transistor to be controlled by the output of the OTA and the output of the OTA is controlled by the plus input of the OTA and the plus input of the OTA is controlled by the first voltage source via the first transistor. Because the output voltage of the OTA and the plus input voltage of the OTA are the same, the bipolar transistor conducts no current. Note that during this light load state very low current is pulled from the voltage source, thereby ensuring that this circuit can be used in low power applications. During the heavy load state, current from a first drain tie-back and a second drain tie-back (associated with the MOS transistor) increase substantially thus shifting control of the MOS transistor's gate voltage from the first transistor and the OTA, to the second transistor.

With the second drain tie-back contributing current to the gate node of the MOS transistor and the negative feedback effect of the second drain tie-back, the impedance at the gate of the MOS transistor is low while the current at the gate node is high allowing the second transistor to move the MOS transistor's gate voltage quickly. With the second drain tie-back's current substantially higher than the OTA's output current, the second drain tie-back increases the speed of the gate node voltage substantially more than the OTA's ability to drive the gate node voltage quickly. The increase in speed as load increases is necessary because as load increases the frequency response of the overall loop increases. In this state, the second drain tie-back can maintain stability of the circuit.

In one embodiment, the first voltage source is VDD, the second voltage source is VSS, the bipolar transistor is an NPN transistor, the first and second transistors are NMOS transistors, and the MOS device is a composite device including PMOS transistors.

DETAILED DESCRIPTION OF THE FIGURES

In accordance with one aspect of the invention, drain "tie-backs" from the MOS device can advantageously reduce the time to turn off the MOS device. A drain tie-back provides a feedback path from a drain of the driven MOS device to a node preceding the gate of the MOS device. In one embodiment, two drain tie-backs can be used to quickly turn off the MOS device as well as ensure stability of the circuit including the MOS device.

Exemplary Circuit Implementation

General description of circuit 200.

Figure 1:
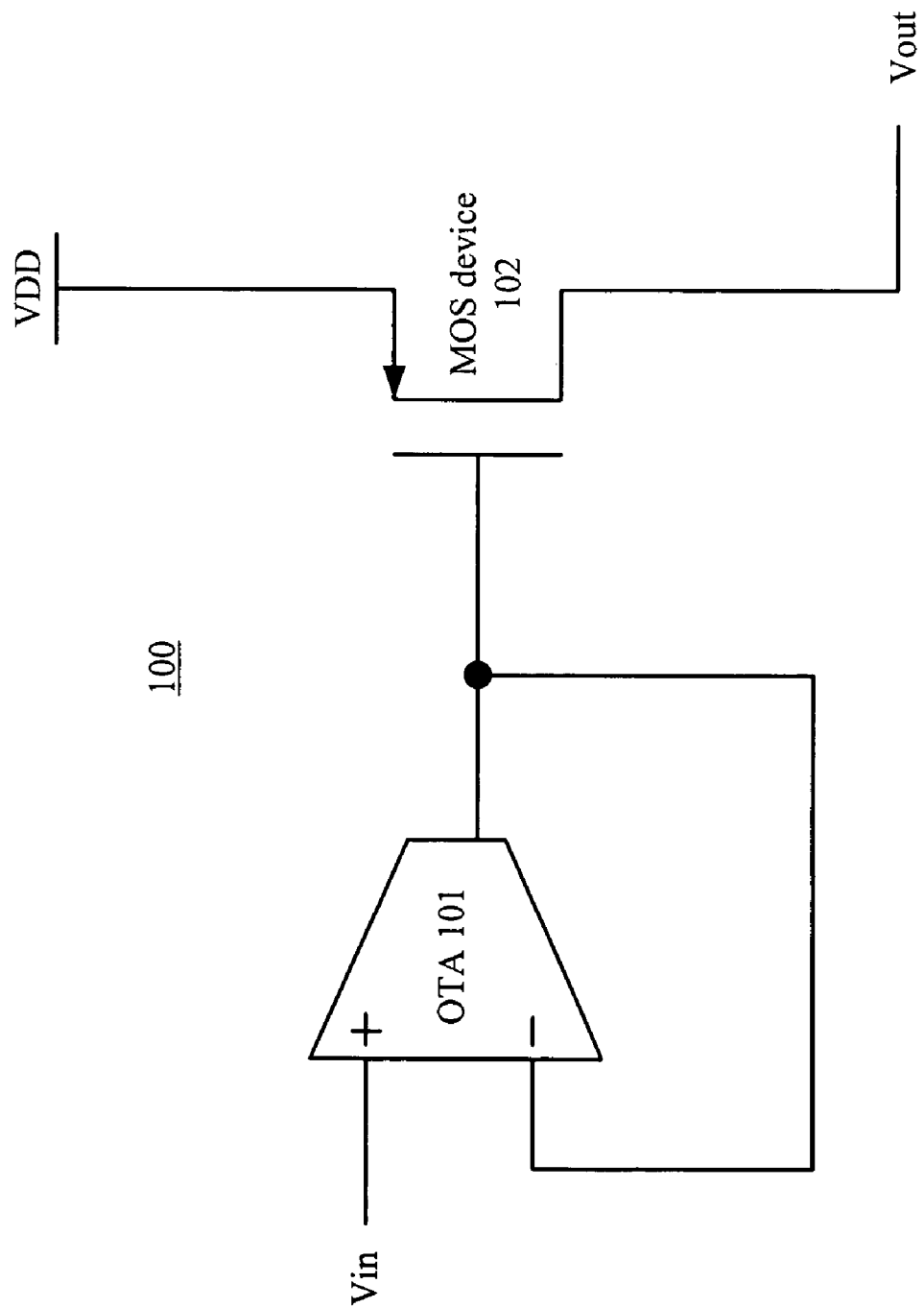
FIG. 1 illustrates a conventional circuit in which an operational transconductance amplifier (OTA) drives the gate of a large MOS device.
Figure 2A:
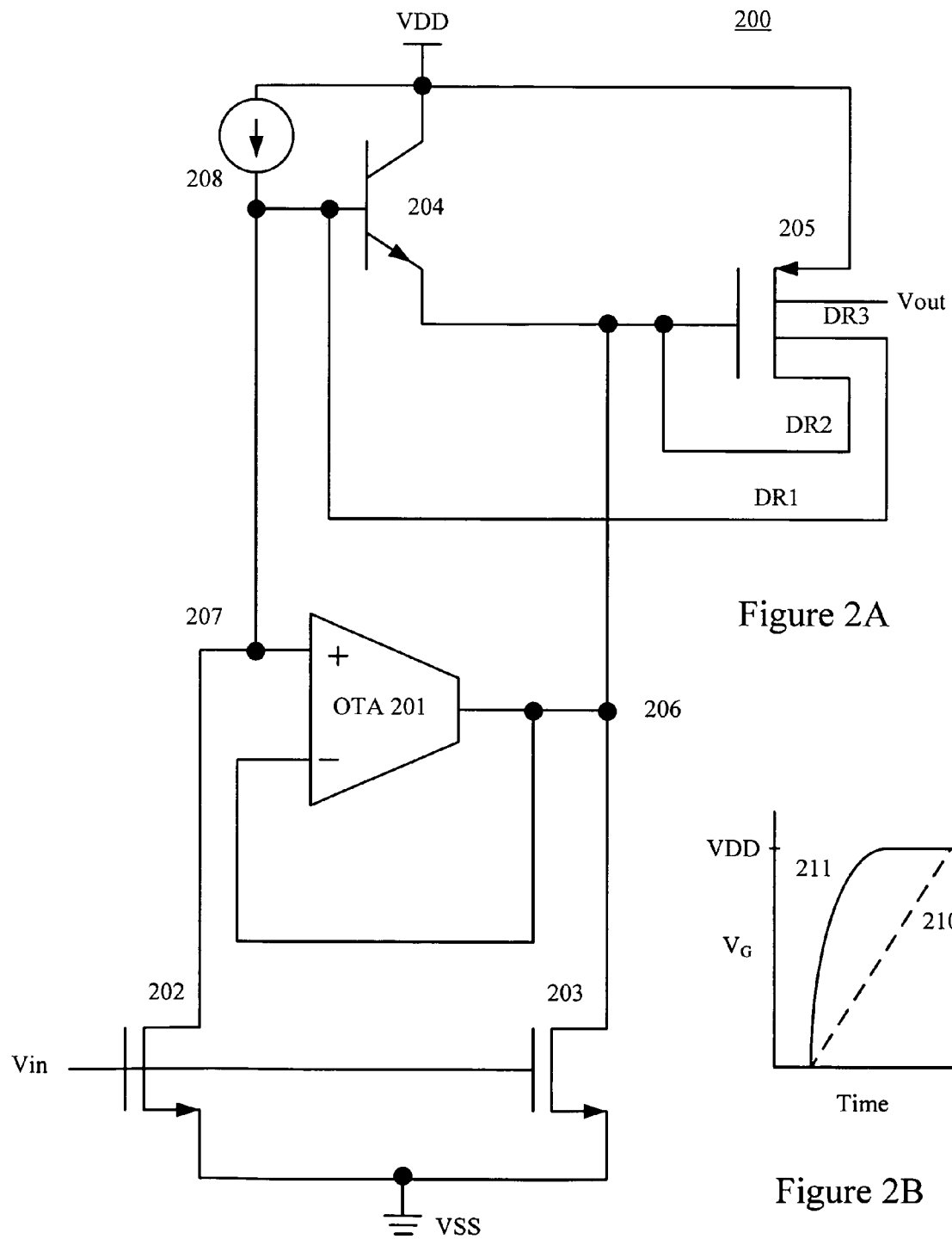
FIG. 2A illustrates an improved circuit including drain "tie-backs" that can advantageously reduce the turn off time of the MOS device.

FIG. 2A illustrates an exemplary circuit 200 including two drain tie-backs to facilitate improved gate driving during different operating conditions. In circuit 200, an operational transconductance amplifier (OTA) 201 has a positive input terminal (+), a negative input terminal (−), and an output terminal. In this embodiment, the output terminal of OTA 201, i.e. node 206, can be connected to its negative input terminal as well as to the gate of an MOS device 205. In this configuration, the transductance (i.e. the gm) of OTA 201 can be used to partially counter the parasitic capacitance of the gate of MOS device 205.

Two NMOS transistors 202 and 203 are configured to receive input voltage Vin on their gates. NMOS transistor 202 has its source connected to voltage source VSS (e.g. ground) and its drain connected to the positive terminal of OTA 201 and node 207. In contrast, NMOS transistor 203 has its source connected to VSS and its drain connected to the negative terminal of OTA 201 and node 206. In this configuration, NMOS transistors 202 and 203 act as common source voltage gain amplifiers that provide two substantially identical currents to nodes 207 and 206, respectively.

Slew limits of circuit 200.

Node 206 follows node 207 as best it can by using the negative feedback loop of OTA 201. However, because node 206 is connected to the gate of MOS device 205, node 206 can be affected by the capacitance of that gate. In an optimal regulator, node 206 can quickly move from 0 V to VDD to turn off MOS device 205. Notably, if MOS device 205 does not turn off quickly, then signal Vout overshoots, which is highly undesirable.

Figure 3:
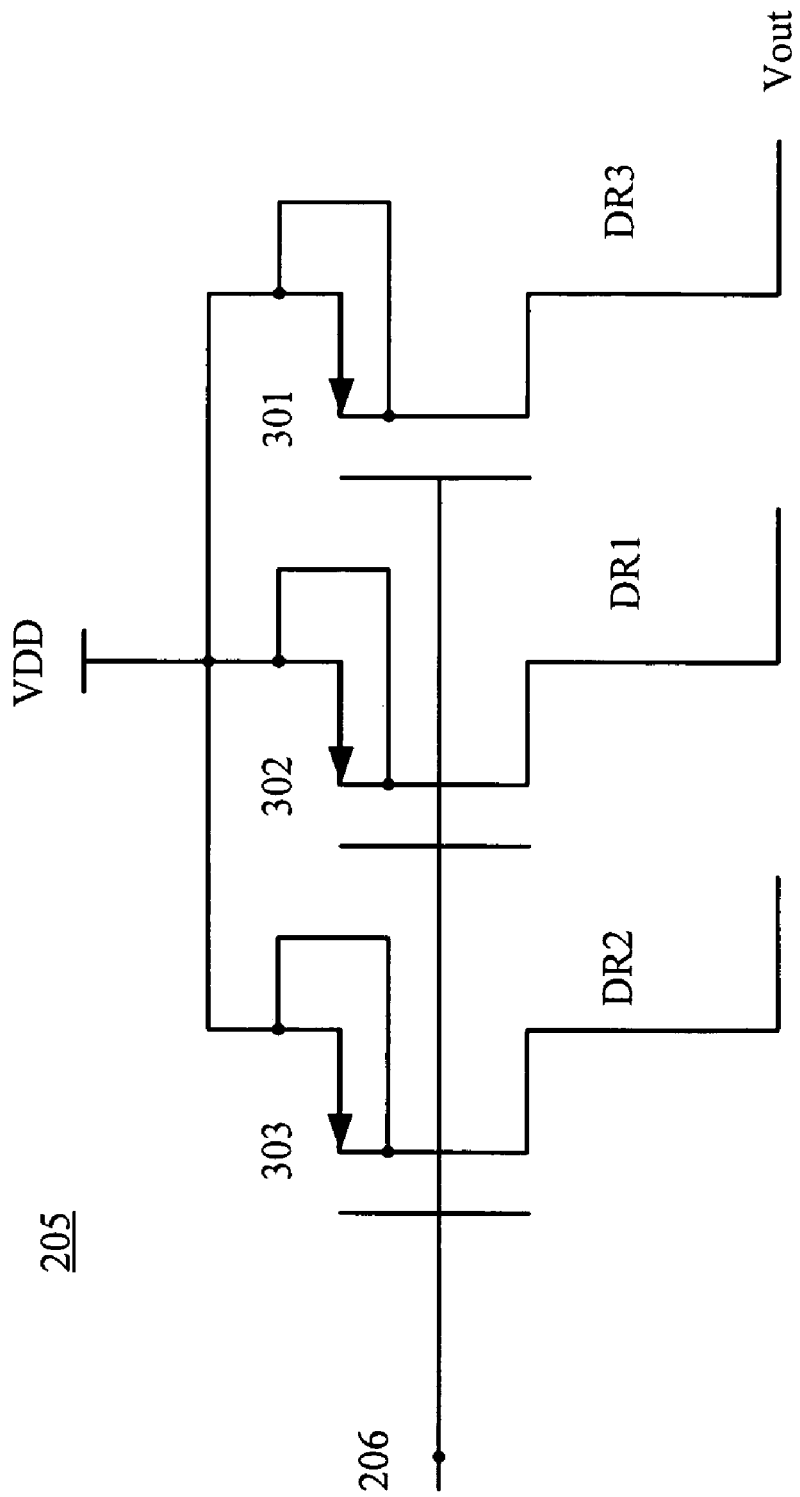
FIG. 3 illustrates an exemplary implementation of an MOS device with three drains DR1, DR2, and DR3.

FIG. 3 illustrates an exemplary implementation of MOS device 205 with drains DR1, DR2, and DR3. Specifically, MOS device 205 can be characterized as including three PMOS transistors 301, 302, and 303 configured to implement a composite device. In this embodiment, PMOS transistor 301 is significantly larger than PMOS transistors 302 and 303. For example, PMOS transistor 301 could be sized as 1000/1 (width/length) whereas PMOS transistors 302 and 303 could be sized as 5/1.

Notably, the sources of PMOS transistors 301, 302, and 303 are commonly connected to voltage source VDD whereas the gates are commonly connected to node 206. The drain DR3 of PMOS transistor 301 provides the output signal Vout of MOS device 205. Thus, the current through drain DR3 is the wanted load current of MOS device 205.

If MOS device 205 is fully off, then the current through drains DR1, DR2, and DR3 is zero. However, if MOS device 205 is still somewhat on, then current is present in drains DR1, DR2, and DR3. Because of the sizing differential between drains DR1, DR2, and DR3, the current through drains DR1 and DR2 is proportional to but significantly smaller than the current through drain DR3. As explained below, the drains DR1 and DR2 can advantageously provide drain tiebacks that assist in turning off MOS device 205.

Specifically, node 207 and drain DR1 are connected to the base of an NPN transistor 204. A small current source 208 is connected between voltage source VDD and the base of NPN transistor 204. In this configuration, in the absence of any pull down on node 207 (e.g. when NMOS transistor 202 turns on), current source 208 and any current contributed by drain DR1 pulls up the voltage at the base of NPN transistor 204, thereby turning on NPN transistor 204. The resulting current through NPN transistor 204 is advantageously multiplied by the beta of NPN transistor 204 (typically in the range of 50-100). The emitter of NPN transistor 204 is connected to the gate of MOS device 205. Thus, the current through DR1 can pull up the voltage applied to the gate of MOS device 205. Note that the difference between the threshold voltage of MOS device 205 and the $V_{BE}$ of NPN transistor 204 (e.g. 0.7 V) is small enough that therefore, in this embodiment, NPN transistor 204 can drive the gate voltage to approximately the threshold voltage of MOS device 205.

The drain DR2 is connected directly to the gate of MOS device 205. In this configuration, the current through drain DR2, albeit much smaller than the current through NPN transistor 204 (triggered by the current through drain DR1), can also contribute to the acceleration of the gate voltage transition.

DR1 drain connection to the gate of 205 also assures stability when control of the Vout occurs via Vin to transistor 203 to gate of 205.

Thus, the drain tie-backs provided by drains DR1 and DR2 can advantageously slew the capacitance and accelerate the low to high transition of the gate voltage of MOS device 205, thereby accelerating the turn off of MOS device 205.

Figure 2B:
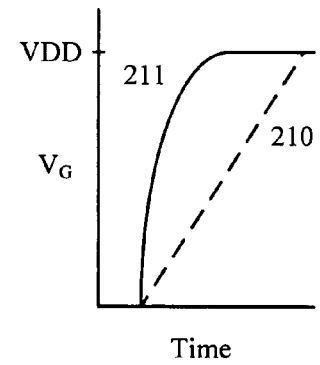
FIG. 2B illustrates a graph plotting the gate voltage $V_G$ of the MOS device versus time. As indicated in this graph, the two drain tie-backs considerably accelerate the $V_G$ transition from zero to VDD, thereby greatly minimizing the possibility of a Vout overshoot.

FIG. 2B illustrates a graph 200 plotting the gate voltage $V_G$ of MOS device 205 versus time. In graph 200, a curve 210 represents the $V_G$ transition using only OTA 201 whereas curve 211 represents the $V_G$ transition using OTA 201 as well as the two drain tie-backs provided by drains DR1 and DR2. As indicated in graph 200, the two drain tie-backs considerably accelerate the $V_G$ transition from zero to almost VDD, thereby greatly minimizing the possibility of a Vout overshoot.

Operation During Heavy, Heavy To Light, And Light Loads

In operation, circuit 200 typically has a load connected to Vout. However, when the load is disconnected, the regulator including circuit 200 cannot instantaneously respond to that disconnection. Specifically, the gate voltage of MOS device 205 cannot change from near Vss to VDD at the instant that the load is disconnected. The purpose of circuit 200 is to accelerate that transition and minimize the overshoot of Vout.

Figure 4:
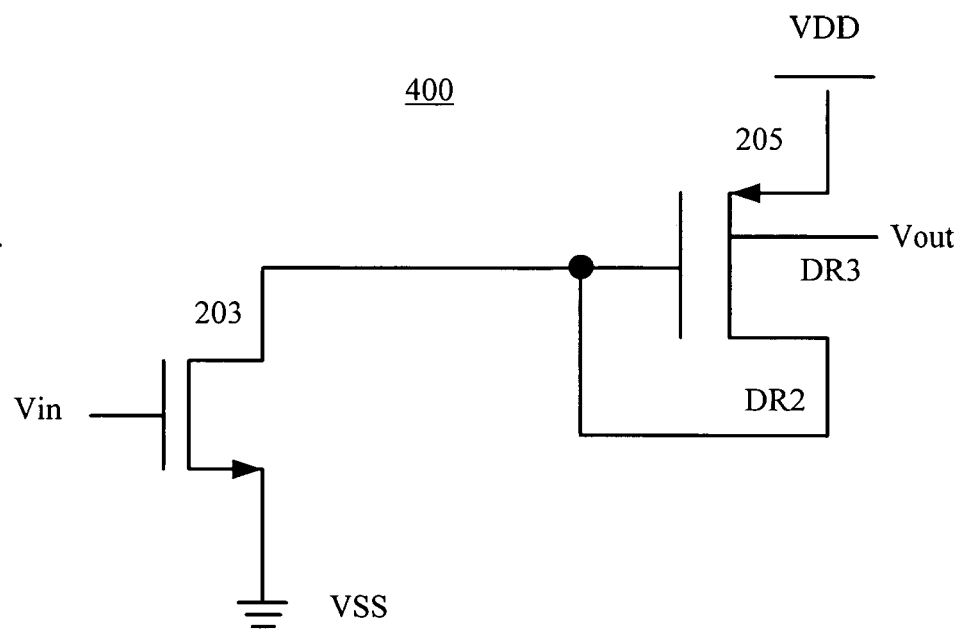
FIG. 4 illustrates a circuit that is equivalent to the circuit of FIG. 2A connected to a heavy load.

FIG. 4 illustrates a circuit 400 that is equivalent to circuit 200 connected to a heavy load. In this case, the input voltage Vin would be high, thereby indicating a load is connected to Vout. A high Vin turns on NMOS transistors 202 and 203. Therefore, drain DR1 (which is connected to the drain of NMOS transistor 202) and drain DR2 (which is connected to the drain of NMOS transistor 203) become ground currents.

With the voltage high on Vin, the voltage at nodes 206 and 207 are both at Vss or near Vss, thereby providing maximum current through drain DR3 and stabilizing circuit 200.

Figure 5:
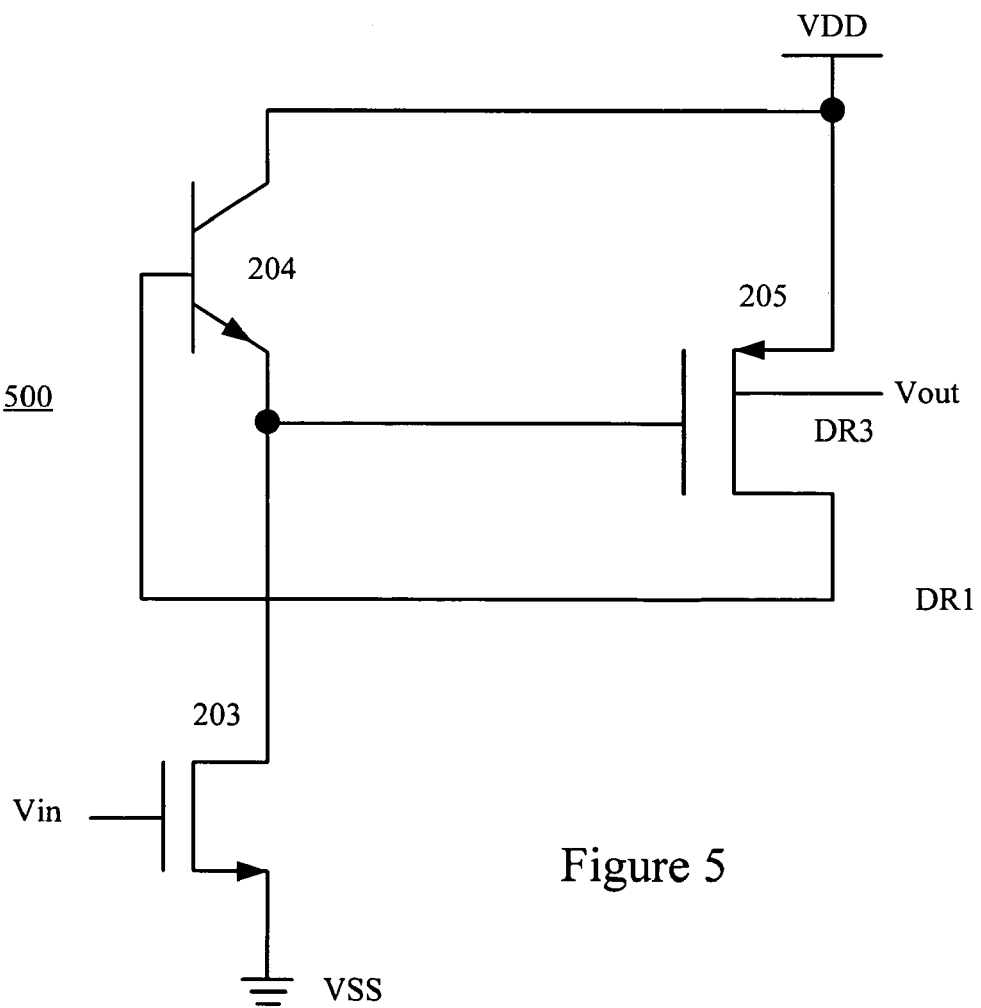
FIG. 5 illustrates a circuit that is equivalent to the circuit of FIG. 2A during a heavy to light load transition.

FIG. 5 illustrates a circuit 500 that is equivalent to circuit 200 during a heavy to light load transition. In this case, the input voltage Vin would be transitioning from high to low, thereby indicating that a load is being disconnected from Vout. With this Vin, NMOS transistors 202 and 203 are turning off. In a transition heavy to light load condition, NPN transistor 204 provides the bulk of the pull up on the gate of MOS transistor 205 using the drain tie-back of drain DR1. Note that the drain tie-back of drain DR2 also provides some contribution, but is minimal compared to the contribution provided by drain tie-back DR1 being multiplied by Q204's beta. Specifically, as explained previously, the current through drain DR1 is multiplied by the beta of NPN transistor 204. The resulting current can counter the capacitance on the gate of MOS device 205, thereby accelerating its turnoff.

Figure 6:
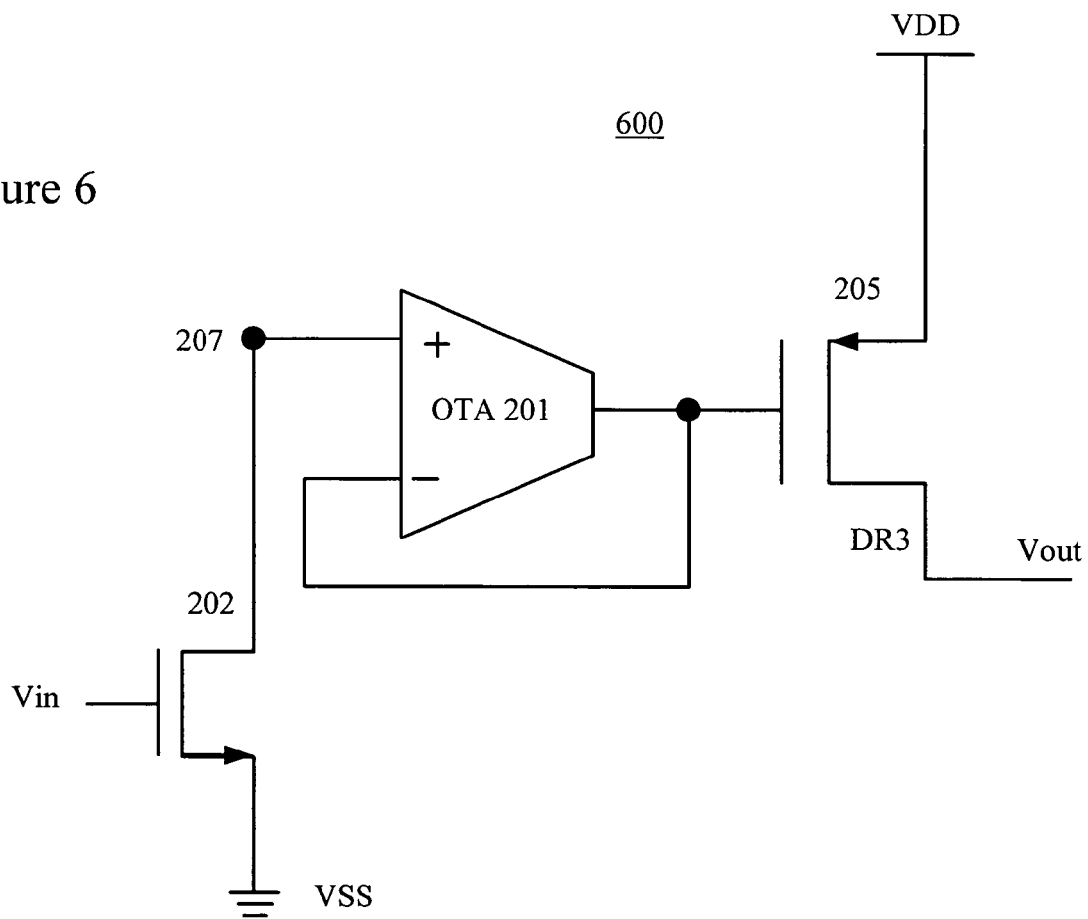
FIG. 6 illustrates a circuit that is equivalent to the circuit of FIG. 2A connected to a light load.

FIG. 6 illustrates a circuit 600 that is equivalent to circuit 200 connected to a light load. In this case, the input voltage Vin would be low, thereby indicating a light load is connected to Vout. A low Vin turns off NMOS transistors 202 and 203. Referring back to FIG. 2A, Note, with little or no current coming from DR1, current source 208 pulls node 207 to Vdd allowing the OTA output to hold the gate voltage of 205 at VDD. OTA 201 can drive the gate of MOS device 205 substantially by itself and maintain stability during this light load state.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, NMOS transistors 202 and 203 could be implemented using bipolar devices. Additionally, all n-type devices could be changed to be p-type devices and vice versa. In one embodiment, a second current source (i.e. in addition to current source 208) can be connected between VDD and the emitter of bipolar transistor 204.

Accordingly, it is intended that the scope of the invention be defined by the following Claims and their equivalents.

The invention claimed is:

1. A circuit including:
   an operational transconductance amplifier (OTA) having a positive input terminal, a negative input terminal, and an output terminal connected to the negative input terminal;
   an MOS device having a gate connected to the output terminal of the OTA, a source connected to a first voltage source, a second drain connected to the gate of the MOS device, and a third drain providing an output signal of the circuit;
   a bipolar transistor having a collector connected to the first voltage source, a base connected to the first drain of the MOS device and the positive input terminal of the OTA, and an emitter connected to the gate of the MOS device; and
   a current source connected between the first voltage source and the base of the bipolar transistor.

2. The circuit of claim 1, wherein the first and second drains of the MOS device are smaller than the third drain.

3. The circuit of claim 1, further including:
   a first transistor connected between a second voltage source and the positive input terminal of the OTA; and
   a second transistor connected between the second voltage source and the gate of the MOS transistor,
   wherein the first and second transistors receive an input signal to the circuit.

4. The circuit of claim 3, wherein the first voltage source is VDD and the bipolar transistor is an NPN transistor.

5. The circuit of claim 3, wherein the first voltage source is VDD and the MOS device includes a PMOS transistor.

6. The circuit of claim 3, wherein the second voltage source is VSS and the first and second transistors include NMOS transistors.

7. A method of driving an MOS device, the method comprising:
   using drain tie-backs of the MOS device to accelerate its turn off.

8. The method of claim 7, wherein a first tie-back is connected to a gate of the MOS device, a second tie-back is connected to a base of a bipolar device, and an emitter of the bipolar device connected to the gate of the MOS device.

9. The method of claim 8, further including using an operational transconductance amplifier (OTA) to stabilize the MOS transistor in its light load and off state.

10. The method of claim 8, further including using the first tie-back to stabilize the MOS device in its on state.

11. The method of claim 8, further including sizing drains of the MOS device to provide a desired turn off acceleration.

12. The method of claim 11, wherein first and second drains associated with the first and second tie-backs are sized significantly smaller than a third drain associated with an output terminal of the MOS device.

13. A method of driving a gate of an MOS device, an output terminal of the MOS device connected to a load, the method comprising:

using drain tie-backs of the MOS device to accelerate its turn off during a transition from a heavy load state to a light load state.

14. The method of claim 13, wherein a first drain of the MOS device is connected to the gate of the MOS device, thereby forming a first tie-back, wherein a second drain is connected to a base of a bipolar device, thereby forming a second tie-back, and wherein an emitter of the bipolar device is connected to the gate of the MOS device.

15. The method of claim 14, further including using an operational transconductance amplifier (OTA) to stabilize the MOS transistor during the light load state.

16. The method of claim 14, further including using the first tie-back to stabilize the MOS device during the heavy load state.

17. The method of claim 14, further including sizing the first, second, and third drains of the MOS device to provide a desired turn off acceleration.

18. The method of claim 17, wherein the first and second drains are sized significantly smaller than the third drain.

19. The method of claim 14, wherein during a transition from a light load state to heavy load state, the first and second drains provide currents to the gate of the MOS device that keep an impedance sufficiently low such that an increased frequency response during the heavy load state maintains stability of the MOS device.

* * * * *